(12) United States Patent
Yang et al.

(10) Patent No.: US 9,467,748 B2
(45) Date of Patent: Oct. 11, 2016

(54) SIGNAL PROCESSING APPARATUS AND SIGNAL PROCESSING METHOD THEREOF

(71) Applicant: SAMSUNG ELECTRONICS CO., LTD., Suwon-si (KR)

(72) Inventors: Hyun-koo Yang, Seoul (KR); Sung-hee Hwang, Suwon-si (KR); Sung-ryul Yun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 20 days.

(21) Appl. No.: 14/484,497

(22) Filed: Sep. 12, 2014

(65) Prior Publication Data
US 2015/0095965 A1    Apr. 2, 2015

(30) Foreign Application Priority Data

Sep. 27, 2013    (KR) .................. 10-2013-0115740

(51) Int. Cl.
| | | |
|---|---|---|
| H04N 7/173 | (2011.01) | |
| H04N 21/61 | (2011.01) | |
| H04N 21/2389 | (2011.01) | |
| H04L 1/00 | (2006.01) | |
| H04N 21/2383 | (2011.01) | |
| H04H 60/07 | (2008.01) | |
| H03M 13/25 | (2006.01) | |
| H03M 13/35 | (2006.01) | |
| H03M 13/00 | (2006.01) | |

(52) U.S. Cl.
CPC ......... *H04N 21/6112* (2013.01); *H03M 13/25* (2013.01); *H03M 13/35* (2013.01); *H03M 13/6516* (2013.01); *H03M 13/6552* (2013.01); *H04H 60/07* (2013.01); *H04L 1/0009* (2013.01); *H04L 1/0017* (2013.01); *H04L 1/0057* (2013.01); *H04N 21/2383* (2013.01); *H04N 21/2389* (2013.01); *H04L 2001/0096* (2013.01)

(58) Field of Classification Search
CPC ..................... H02N 21/2384; H02N 21/6112; H02N 21/23605; H02N 21/33608; H02N 21/2383
See application file for complete search history.

(56) References Cited

U.S. PATENT DOCUMENTS 7,443,878 B2 *   10/2008   Hendel .................. H04L 45/745
                                                                 370/463

(Continued)

FOREIGN PATENT DOCUMENTS

| EP | 2 555 510 A2 | 2/2013 |
|---|---|---|
| KR | 10-2012-0051574 A | 5/2012 |

OTHER PUBLICATIONS

Communication dated Dec. 23, 2014 issued by the Int. Searching Authority in counterpart Int. Application No. PCT/KR/2014009017 (PCT/ISA/210).

(Continued)

*Primary Examiner* — Olugbenga Idowu
(74) *Attorney, Agent, or Firm* — Sughrue Mion, PLLC (57) ABSTRACT

A signal processing apparatus is provided. The signal processing apparatus includes: a packet classifier configured to receive a transport stream including a content, and classify a plurality of packets constituting the content into a plurality of packet groups according to a predetermined condition; and a transport unit configured to transport the plurality of packet groups through a plurality of signal processing routes to each of which a different signal processing method is applied.

18 Claims, 6 Drawing Sheets

(56) References Cited

U.S. PATENT DOCUMENTS

| | | |
|---|---|---|
| 2011/0235701 A1 | 9/2011 | Kim et al. |
| 2011/0286535 A1 | 11/2011 | Ko et al. |
| 2013/0089202 A1* | 4/2013 | Altmann ............ H04N 21/4122 380/211 |
| 2013/0121307 A1 | 5/2013 | Murakami et al. |
| 2013/0235159 A1 | 9/2013 | Kim et al. |
| 2013/0291046 A1* | 10/2013 | Ko ........................ H04L 5/0053 725/116 |
| 2015/0058908 A1* | 2/2015 | Ko ..................... H04N 21/2383 725/116 |

OTHER PUBLICATIONS

Communication dated Dec. 23, 2014 issued by the Int. Searching Authority in counterpart Int. Application No. PCT/KR/2014009017 (PCT/ISA/237).

\* cited by examiner

TSPS : Transport stream partial stream
PLP : Physical layer pipe

SIGNAL PROCESSING APPARATUS AND SIGNAL PROCESSING METHOD THEREOF

CROSS-REFERENCE TO RELATED APPLICATION

This application claims priority under 35 U.S.C. §119 from Korean Patent Application No. 10-2013-0115740, filed on Sep. 27, 2013 in the Korean Intellectual Property Office, the disclosure of which is incorporated herein in its entirety by reference.

BACKGROUND

1. Field

Apparatuses and methods consistent with exemplary embodiments of the inventive concept generally relate to transmitting, receiving and processing of a transport stream.

2. Description of the Related Art

In an information-oriented society in 21st century, a broadcasting communication service is required to achieve digitization, a multi-channel service, a broadband service, and a high quality. Specially, with recent popularization of a high-definition (HD) digital TV, a portable multimedia player (PMP), and a portable broadcasting device, digital broadcasting is required to support various receiving methods.

Digital Video Broadcasting-Second Generation Terrestrial (DVB-T2) is a terrestrial digital broadcasting standard established by improving performance of a Digital Video Broadcasting-Terrestrial (DVB-T).

The DVB-T2 standard applies a Physical Layer Pipe (PLP) concept that provides a physical channel to a physical layer. Different PLPs may have different characteristics such as different modulation methods, channel coding rates, time constraints, cell interleaving lengths, and the like, and thus, it is possible to provide various broadcasting services by using such characteristics.

According to the DVB-T2 standard, data to be processed by a PLP is classified by broadcasted services. Hence, one PLP may processes all data related to a single service even when this data includes various video data and audio data requiring different Quality of Services (QoS). That is, all of the data may be processed by a PLP which provides the highest QoS.

As such, the DVB-T2 standard does not consider that different QoSs may be required for different types of data for a single service, which causes a problem of inefficiency in processing and transmitting data.

SUMMARY

One or more exemplary embodiments are provided to address the aforementioned and other problems and disadvantages occurring in the related art.

According to an aspect of an exemplary embodiment, there is provide a signal processing apparatus which may include: a packet classifier configured to receive a transport stream including a content, and classify a plurality of packets constituting the content into a plurality of packet groups according to a predetermined condition; and a transport unit configured to transport the plurality of packet groups through a plurality of signal processing routes to each of which a different signal processing method is applied.

The different signal processing method may include comprise at least one of a different coding rate, a different coding type, and a different interleaving length or unit.

The predetermined condition may be a type of data constituting the plurality of packets.

The packet classifier may determine the type of data constituting the packets by using a Packet Identifier (PID) included in each of the plurality of packets.

The transport unit may multiplex at least one packet included in each of the packet groups with a null packet and transmit the multiplexed packet.

The plurality of signal processing routes may be Physical Layer Pipes (PLPs) defined in the DVB-T2.

According to an aspect of another exemplary embodiment, there is provided a signal processing method which may include: receiving a transport stream including a content, classifying a plurality of packets constituting the content into a plurality of packet groups according to a predetermined condition; and transporting the plurality of packet groups through a plurality of signal processing routes to each of which a different signal processing method is applied.

The different signal processing method may include at least one of a different coding rate, a different coding type, and a different interleaving length or unit.

The number of packets included in each packet group may be the same as the number of the plurality of packets. The plurality of packet groups may include the same number of packets. At least one packet group may include a null packet so that the number of packets included in the at least one packet group is the same as the number of the plurality of packets. The transport stream may have the same bit rate as each packet group.

A first packet group may include first data which belong to a base layer, and a second packet group may include second data which belong to an enhanced layer. A signal processing route through which the first packet group is transported may provide a more robust encoding operation than a signal processing route through which the second packet group is transported in terms of at least one of a coding type and a coding rate. Data included in the first packet group may not refer to another data included in another packet group to provide a service to a user.

A first packet group may include left eye image data of a three-dimensional (3D) image while the second packet group may include right eye image data of the 3D image.

One packet group or one signal processing route may include information common to all remaining packet groups or all remaining signal processing routes. The common information may include at least one of a Program Association Table (PAT), a Program Map Table (PMT), a Network Information Table (NIT), a Service Description Table (SDT) and an Event Information Table (EIT).

According to the aforementioned various exemplary embodiments, various data which exist in a single service may be processed differently according to a type of data and transmitted. Hence, the efficiency in processing and transmitting data may be enhanced.

BRIEF DESCRIPTION OF THE DRAWINGS

The above and/or other aspects of the inventive concept will be more apparent by describing certain exemplary embodiments of the inventive concept with reference to the accompanying drawings, in which.

DETAILED DESCRIPTION OF THE EXEMPLARY EMBODIMENTS

Certain exemplary embodiments are described in greater detail below with reference to the accompanying drawings.

In the following description, like drawing reference numerals are used for the like elements, even in different drawings. The matters defined in the description, such as detailed construction and elements, are provided to assist in a comprehensive understanding of exemplary embodiments. However, exemplary embodiments can be practiced without those specifically defined matters. Also, well-known functions or constructions are not described in detail since they would obscure the inventive concept with unnecessary detail.

Figure 1:
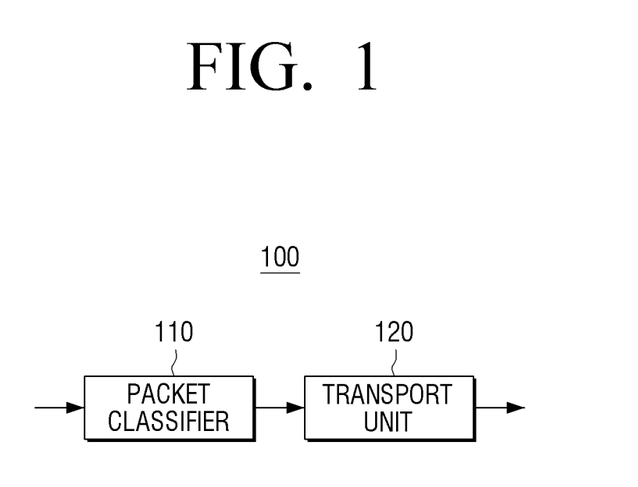
FIG. 1 is a block diagram for explaining a structure of a signal processing apparatus according to an exemplary embodiment.

FIG. 1 is a block diagram for explaining a structure of a signal processing apparatus according to an exemplary embodiment. According to FIG. 1, a signal processing apparatus 100 includes a packet classifier 110 and a transport unit 120.

The packet classifier 110 receives a transport stream including data of a content. Herein, the content may be a program which includes at least one video data and audio data. The video data and audio data may constitute a transport steam as a form of packet.

Meanwhile, the transport stream may be a Single Program (SP) transport stream including a single program or may be a Multi Program (MP) transport stream which is formed from multiplexed SP transport streams. Accordingly, the MP transport stream may include a plurality of programs.

In addition, the transport stream may include information which defines a relation between a program and at least one video data and audio data constituting the program, for example, Program Specification Information (PSI).

In addition, the packet classifier 110 may classify a plurality of packets including content into a plurality of packet groups according to a predetermined condition.

To be specific, the packet classifier 110 may classify a plurality of packets into a plurality of packet groups according to a type of data included in the plurality of packets. In this case, the packet classifier 110 may determine the type of data by using a packet identifier (PID) included in each of the plurality of packets.

For example, the packet classifier 110 may classify a packet including data which belongs to a base layer and a packet including data which belongs to an enhanced layer into different packet groups. Herein, the data which belongs to the base layer and the data which belongs to the enhanced layer may be video data generated by being encoded in a Scalable Video Coding (SVC) method.

As another example, the packet classifier 110 may classify a packet including left eye image data and a packet including right eye image data into different packet groups. Herein, the left eye image data and the right eye image data may be video data generated to have a certain time difference in order to provide a user with a three-dimensional (3D) image.

Although the aforementioned examples describe that the packet classifier 110 determines a type of data constituting a packet by using a PID, the inventive concept is not limited thereto, and various other methods may be employed to determine a type of data. For example, the packet classifier 110 may determine a type of data constituting a packet by using information included in a separate extension field provided in the packet.

The transport unit 120 may transport the plurality of packet groups through a plurality of signal processing routes, respectively, where different signal processing methods are applied. For example, the plurality of signal processing routes may apply different coding rates to the received packet groups.

In this case, the transport unit 120 may multiplex at least one packet which belongs to at least one packet group with a null packet and transmit the multiplexed packet. That is, in order to form a signal processing unit which is processible by a signal processing route, that is, a unit of signal for processing in one signal processing route, the transport unit 120 may insert a null packet into at least one of the plurality of packet groups, generate transport streams so that the at least one of the packet groups has a bit rate which is the same as a bit rate before the plurality of packets are classified into the plurality of packet groups, and transport the transport streams generated by including the null packet through the signal processing routes, respectively.

Each of the plurality of signal processing routes may be a PLP defined by the DVB-T2 standard. Herein, a PLP refers to a route where a service is transmitted or a stream which is transmitted through the route, and in the DVB-T2 standard, a modulation method, a coding method, a coding rate, and an interleaving unit may differ by PLP.

For example, it is assumed that the signal processing apparatus 100 receives a transport stream from a broadcasting service provider such as a broadcasting station, and transports the received transport stream to a digital broadcasting transmitter (not shown) according to the DVB-T2 standard. In this case, the signal processing apparatus 100 may classify the transport stream received from the broadcasting service provider into a plurality of packet groups according to a type of data, and may transmit transport streams generated from the plurality of packet groups through respective PLPs provided for the digital broadcasting transmitter (not shown) so that the digital broadcasting transmitter (not shown) is able to process packets having different types of data through different PLPs.

The digital broadcasting transmitter (not shown) described above may be a digital broadcasting transmitter 300 illustrated in FIG. 3A to be detailed later.

Each of the plurality of signal processing routes may be a signal processing route which corresponds to a PLP suggested by a next-generation broadcasting standard such as Advanced Television Systems Committee (ATSC) 3.0, etc.

Hence, the signal processing apparatus 100 may allow video data and/or audio data constituting a program to be processed by different PLPs according to a type of data.

For example, a transport stream may have a packet including data which belongs to a base layer and a packet including data which belongs to an enhanced layer.

In this case, the packet classifier 110 may classify a plurality of packets constituting the transport stream into a first packet group including the data which belongs to the base layer and a second packet group including the data which belongs to the enhanced layer.

In addition, the transport unit 120 may transport a transport stream generated by adding a null packet to the first packet group through a first PLP, and may transport a transport stream generated by adding a null packet to the second packet group through a second PLP. Herein, the first PLP may be a signal processing route which applies an encoding operation which is more robust or stronger to errors than the second PLP in terms of an encoding type or a coding rate.

The following is one reason why a packet group including video data which belongs to the base layer is transmitted through a PLP which performs a more robust or stronger encoding operation than another PLP.

The data which belongs to the base layer may provide a user with a service without referring to other data, while the data which belongs to the enhanced layer may provide a user with a service by referring to other data, for example, certain data which belongs to the base layer. Here, the data which belongs to the base layer may be standard definition (SD) video data, and the data which belongs to the enhanced layer may be high definition (HD) video data, for example.

When a PLP performs a more robust encoding operation than another PLP, there is an increased possibility for a digital broadcasting receiver to receive and restore data transmitted through this PLP even when a channel error occurs during transmission of the data. Thus, by transmitting the data, which belongs to the base layer and can provide a user with a service without referring to other data, through a PLP which performs a more robust encoding operation, a digital broadcasting receiver may be able to provide a user with a service from the data even when a channel error occurs.

As another example, it is assumed that a transport stream constituted by a plurality of packets includes left eye image data and right eye image data.

In this case, the packet classifier 110 may classify the plurality of packets into a first packet group including the left eye image data and a second packet group including the right eye image data.

In addition, the transport unit 120 may transport a first transport stream, in which a null packet is added to the first packet group, through the first PLP, and may transport a second transport stream, in which a null packet is added to the second packet group, through the second PLP. However, the transport unit 120 may transport the first transport stream through the second PLP, and may transport the second transport stream through the first PLP.

Here, the first PLP may be a signal processing route which performs a more robust encoding operation than the second PLP in coding rate, encoding type, or so on.

As such, when a digital broadcasting receiver receives and restores the left eye image data and the right eye image data to achieve a 3D image, it is also possible for the digital broadcasting receiver to provide a user with a two-dimensional (2D) image.

That is, if a channel error occurs while both of the left eye image data and the right eye image data are processed and transmitted through a single PLP, a digital broadcasting receiver may not be able to restore either of the left eye and right eye image data properly. However, if the left eye image data and the right eye image data are processed and transmitted through different PLPs, the digital broadcasting receiver may be able to receive and restore at least one of the left image data and the right image data which is processed through a PLP providing a robust encoding operation than the other PLP even if the same channel error occurs. Thus, it may be possible for the digital broadcasting receiver to provide a user with a 2D image although it is not a 3D image.

In the above exemplary embodiments, the signal processing apparatus 100 in FIG. 1 receives and processes a transport stream, the signal processing apparatus 100 may also receive an Internet Protocol (IP) stream or a General Stream Encapsulation (GSE) stream, classify a plurality of packets in the stream into a plurality of packet groups according to a type of data, and generate and transport streams which include different packet groups to respective PLPs.

Figure 2A:
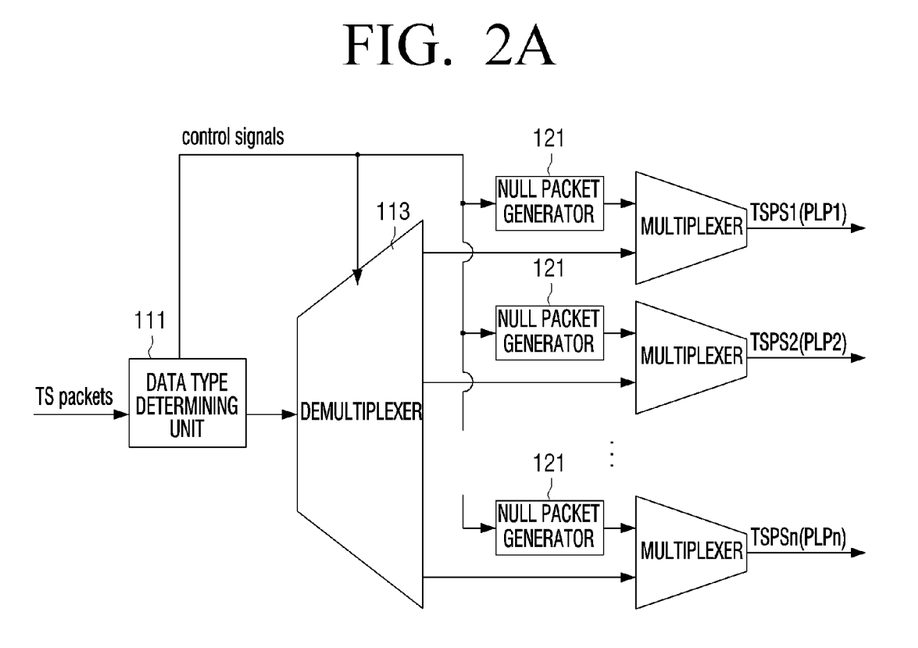
FIGS. 2A and 2B illustrate operations of a signal processing apparatus according to exemplary embodiments.
Figure 2B:
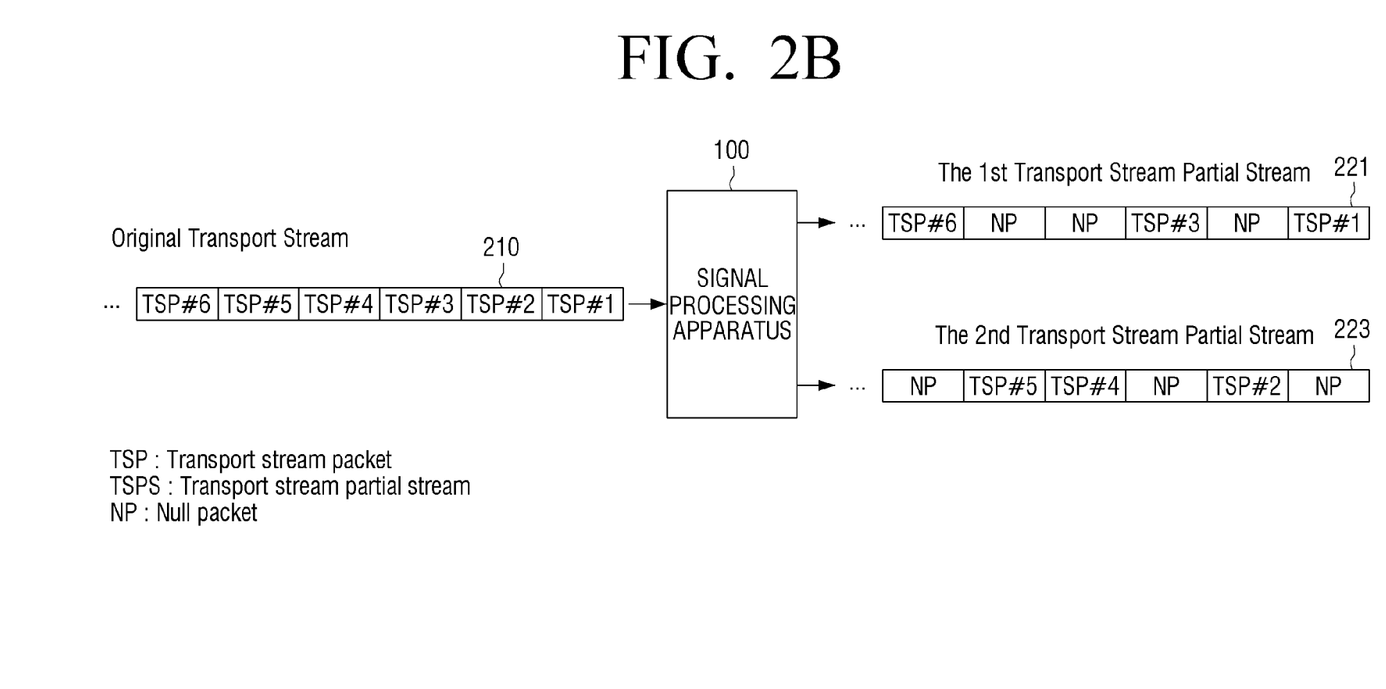

FIGS. 2A and 2B illustrate operations of a signal processing apparatus according to exemplary embodiments.

FIG. 2A is a block diagram for explaining a structure of a signal processing apparatus according to an exemplary embodiment.

According to FIG. 2A, the signal processing apparatus 100 includes a data type determining unit 111, a demultiplexer 113, a null packet generator 121, and a multiplexer 123. The data type determining unit 111 and the demultiplexer 113 may constitute the packet classifier 110 illustrated in FIG. 1, and the null packet generator 121 and the multiplexer 123 may constitute the transport unit 120 illustrated in FIG. 1.

The data type determining unit 111 determines a type of data included in each of a plurality of packets constituting a transport stream. In this case, the data type determining unit 111 may determine a type of data included in each packet by using a PID of each packet.

In addition, the data type determining unit 111 may generate a control signal, and transmit the generated control signal to the demultiplexer 113 and the null packet generator 121. The demultiplexer 113 may demultiplex a plurality of packets into a plurality of packet groups based on the type of data determined by the data type determining unit 111, and the null packet generator 121 may generate a null packet to be multiplexed with at least one or each packet group in order to maintain a bit rate.

The demultiplexer 113 may demultiplex the plurality of packets constituting the transport stream into the plurality of packet groups based on the control signal transmitted by the data type determining unit 111, and output each packet group to the multiplexer 123. In this case, the demultiplexer 113 may demultiplex the plurality of packets into the plurality of packet groups according to the type of data. At this point, it is not required that a single packet is allocated to a single packet group, and this packet may be allocated to the plurality of packet groups simultaneously. For example, a packet or packets including information on services such as PSI defined by the MPEG-2 standards and Program and a System Information Protocol (PSIP) defined by the ATSC standards may be allocated to the plurality of packet groups simultaneously.

For example, the demultiplexer 113 may demultiplex a plurality of packets constituting a transport stream into a packet group including data which belongs to a base layer and a packet group including data which belongs to an enhanced layer. Herein, the packet group including data which belongs to the base layer may include packets which provide information on an individual or independent service using only packets which belong to the packet group in order to provide this individual or independent service to a user. Specifically, this individual or independent service may be generated and provided to the user based on only the packets contained in the packet group of the base layer without using or referring to packets which belong to the enhanced layer, and, for this purpose, the information about this service may have to be contained in this packet group of the base layer.

As another example, the demultiplexer 113 may demultiplex the plurality of packets constituting the transport stream into a packet group including left eye image data and a packet group including right eye image data.

As still another example, when a plurality of packets of a transport stream include media data for two or more services, the demultiplxer 113 may classify the plurality of packets constituting the transport stream according to a service, demulitplex the plurality of packets into a plurality of packet groups, and allocate packets including information on each service to all of the plurality of packet groups simultaneously.

The null packet generator 121 generates null packets to be inserted into packet groups, and transmits the generated null packets to the multiplexer 123. At this point, the null packet generator 121 may generate as many null packets to be added to each packet group as necessary to form a signal processing unit which is processible by a signal processing route, that is, a unit of signal for processing in one signal processing route.

The multiplexer 123 may multiplex the null packets with each packet group, and output each of the transport streams generated by being multiplexed with the null packet, that is, Transport Stream Partial Streams (TSPS) 1, 2, . . . and n to each of the signal processing routes PLP1, PLP2, . . . and PLPn.

FIG. 2B illustrates transport streams which are output from a signal processing apparatus according to an exemplary embodiment.

Referring to FIG. 2B, a transport stream 210 including six packets, that is, packet #1 through packet #6 (TSP#1 through TSP#6) is input to the signal processing apparatus 100.

The signal processing apparatus 100 in FIG. 2B may be the same as the signal processing apparatus 100 in FIG. 1 which classifies a plurality of packets constituting a transport stream according to a type of data included in the packets, generates transport streams by multiplexing at least one packet included in at least one packet group with a null packet, and outputs the transport streams through different signal processing routes.

For example, packet #1, packet #3 and packet #6 among packets #1 through #6 constituting the transport stream 210 may be the packets including data which belongs to the base layer, and packet #2, packet #4 and packet #5 may be the packets including data which belongs to the enhanced layer.

In this case, the signal processing apparatus 100 may classify packets #1 through #6 into a first packet group including packets #1, #3 and #6 and a second packet group including packets #2, #4 and #5.

In addition, the signal processing apparatus 100 may insert null packets into positions where packets #2, #4 and #5 are removed from the first packet group, and may insert null packets into positions where packets #1, #3, and #6 are removed from the second packet group. Inserting the null packets is to allow the packet groups to have a bit rate which is the same as a bit rate of the original transport stream 210.

Further, the signal processing apparatus 100 may transport a first transport stream 221 including the first packet group and a second transport stream 223 including the second packet group through different PLPs.

In the above exemplary embodiments, the signal processing apparatus 100 may process and transport a transport stream received from an external apparatus to a digital broadcasting transmitter according to the DVB-T2 standard, and the digital broadcasting transmitter according to the DVB-T2 standard may process and transmit the transport stream to a digital broadcasting receiver according to the DVB-T2 standard. Hereinafter, more exemplary embodiments are described with respect to a DVB-T2 system.

Figure 3A:
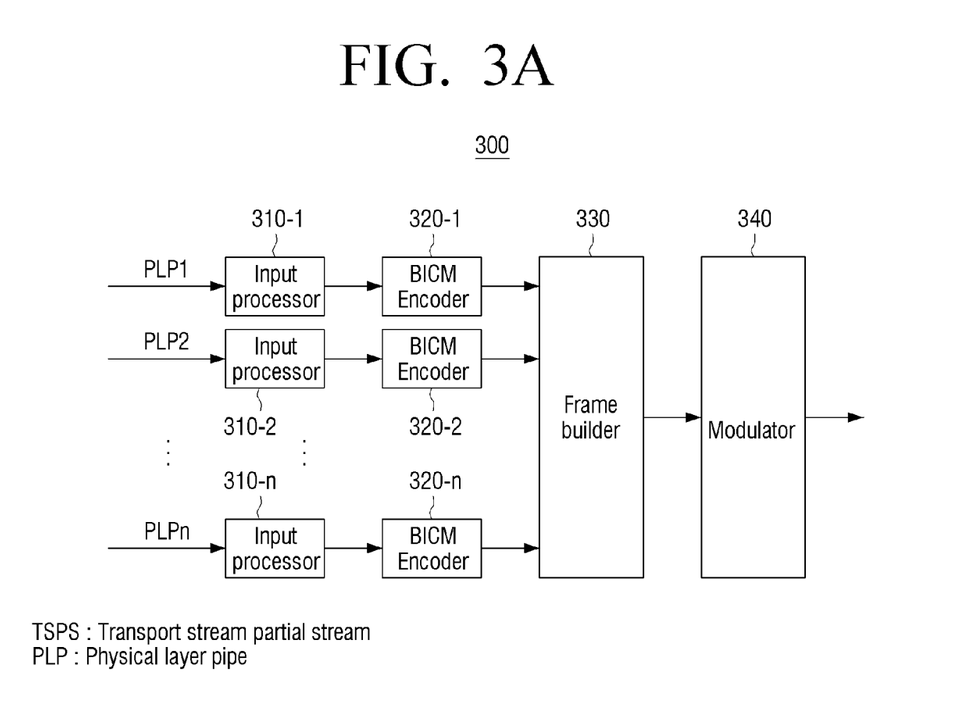
FIGS. 3A and 3B illustrate a structure of a DVB-T2 system according to exemplary embodiments.
Figure 3B:
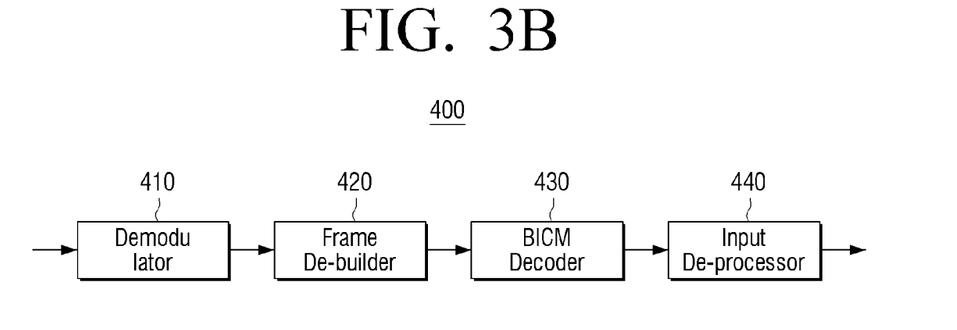

FIGS. 3A and 3B illustrate a structure of a DVB-T2 system according to exemplary embodiments. Specially, the FIG. 3A is a block diagram for explaining the digital broadcasting transmitter 300 according to the DVB-T2 standard, and FIG. 3B is a block diagram for explaining a digital broadcasting receiver 400 according to the DVB-T2 standard.

According to FIG. 3A, the digital broadcasting transmitter 300 may include a plurality of input processors 310-1 through 310-n, a plurality of Bit Interleaver Coding and Modulation (BICM) encoders 320-1 through 320-n, a frame builder 330, and a modulator 340. According to an exemplary embodiment, the plurality of input processors 310-1 through 310-n may constitute a single input processor processing a plurality of PLP1 though PLPn, and the plurality of BICM encoders 320-1 through 320-n may constitute a single BICM encoder.

The input processors 310-1 through 310-n generate Baseband Frames (BBFRAMEs) by receiving streams including service data through a plurality of PLPs. Herein, each of the input streams may be a transport stream, a GSE stream, an IP stream, etc.

In particular, a stream inputted into each of the input processors 310-1 through 310-n may be a stream generated by the signal processing apparatus 100 in FIG. 1. That is, as described above in reference to FIG. 1, the signal processing apparatus 100 may receive a stream from a broadcasting service provider, classify a plurality of packets constituting the stream into a plurality of packet groups according to a type of data, and transmit the packet groups to input processors 310-1, 310-2, . . . and 310-n through the PLP1 through PLPn, respectively.

Here, a data PLP, e.g., one of the PLP1 through PLPn, may include PSI/SI information such as a Program Association Table (PAT), a Program Map Table (PMT), a Network Information Table (NIT), a Service Description Table (SDT), an Event Information Table (EIT), etc. Hence, a transport stream generated by the signal processing apparatus 100 including the same type of data may be transported to and processed by the input processor 310 through the data PLP.

Herein, the NIT representing network information among the PSI/SI information may be embodied as Syntax as shown below. The following descriptor conforms to an expression scheme of DVB-Service Information (SI), and the following descriptor_length field shows a number of total bytes necessary for expressing a descriptor after a byte which represents the field.

| Syntax | Number of bits | Identifier |
|---|---|---|
| T2_delivery_system_descriptor( ){ | | |
|    descriptor_tag | 8 | uimsbf |
|    descriptor_length | 8 | uimsbf |
|    descriptor_tag_extension | 8 | uimsbf |
|    number_plp | 8 | uimsbf |
|    for l=1 to number_plp { | | |
|       plp_id | 8 | uimsbf |
|    } | | |
|    T2_system_id | 16 | uimsbf |
|    If (descriptor_length > 3 + number_plp) { | | |

-continued

| Syntax | Number of bits | Identifier |
|---|---|---|
| SISO/MISO | 2 | bslbf |
| bandwidth | 4 | bslbf |
| ... | | |
| } | | |
| } | | |

As described above, a plurality of packets constituting a single transport stream may be processed in different PLPs according to a type of data, and thus, the NIT may include the number of PLPs (number_plp) used in processing a single transport stream and identifiers of the PLPs (plp_id).

In addition, as another exemplary embodiment for the NIT, it is possible to set an identifier of a PLP group that is a set of PLPs used in processing the single transport stream, include the identifier in the NIT, and transport the identifier of the PLP group and the number and identifiers of the PLPs constituting the PLP group through a signaling region (e.g., a P2 symbol in the DVB-T2). At this point, the NIT representing the network information among the PSI/SI information may be embodied as Syntax as shown below.

| Syntax | Number of bits | Identifier |
|---|---|---|
| T2_delivery_system_descriptor( ){ | | |
| descriptor_tag | 8 | uimsbf |
| descriptor_length | 8 | uimsbf |
| descriptor_tag_extension | 8 | uimsbf |
| number_plp | 8 | uimsbf |
| If (number_plp > 1) { | | |
| plp_group_id | 8 | uimsbf |
| } | | |
| else { | | |
| plp_id | 8 | uimsbf |
| } | | |
| T2_system_id | 16 | uimsbf |
| If (descriptor_length > 5) { | | |
| SISO/MISO | 2 | bslbf |
| bandwidth | 4 | bslbf |
| ... | | |
| } | | |
| } | | |

A plurality of PLPs may include the same PSI/SI information. In this case, the plurality of PLPs may be set as a single PLP group, and the same information may be transmitted through a common PLP related to the PLP group.

A case where only one PLP in a PLP group includes packets containing PSI/SI information is considered. In general, the PSI/SI information is transmitted repeatedly at a particular time interval. Accordingly, in order to find a PLP including the PSI/SI information, it is required to restore all packets of all PLPs which belong to the PLP group and check data in the packets according to a PSI/SI repeat cycle, which may cause delay in an initialization process or a service acquisition process when service information is changed. In particular, in a mobile broadcasting environment, it is necessary to reacquire a service through an expeditious channel search when a service area is changed. According to an exemplary embodiment, when only one PLP in a PLP group includes packets including the PSI/SI information, plp_group_id that is an identifier of the PLP group is set to be the same as plp_id that is an identifier of the PLP including the packets containing PSI/SI information. At this point, a digital broadcasting receiver may expeditiously acquire the PSI/SI information by processing the PLP having plp_id which is the same as plp_group_id first in the service acquisition process.

If, however, all PLPs in the PLP group include packets including the PSI/SI information, different identifiers may be allocated to plp_id and plp_group_id.

The BICM encoder 320 decides a forward error correction (FEC) coding rate and a constellation order according to a region where data to be serviced is transmitted (e.g., a physical layer protocol (PHY) frame for a fixed digital broadcasting receiver or a PHY frame for a mobile digital broadcasting receiver), and performs an encoding operation. The BICM encoder 320 also encodes signaling information about the data to be serviced.

The frame builder 330 and the modulator 340 configure a frame by deciding an Orthogonal Frequency Division Multiplexing (OFDM) parameter for the signaling region and an OFDM parameter for a data region where the data to be serviced is transmitted, generate the frame by adding a sync region, perform an operation for modulating the generated frame to a radio-frequency (RF) signal, and transmit the RF signal to a digital broadcasting receiver.

In this case, information for identifying whether a frame to be received is a frame for a mobile digital broadcasting receiver (hereafter "a mobile frame") or a frame for a fixed digital broadcasting receiver (hereafter "a fixed frame") is inserted into the sync region. When an OFDM parameter for a signaling region or an OFDM parameter for a data region of each frame is not preset, information about the OFDM parameter for the signaling region and the OFDM parameter for the data region is transmitted through the sync region.

According to FIG. 3B, the digital broadcasting receiver 400 may include a demodulator 410, a frame de-builder 420, a BICM decoder 430, and an input de-processor 440.

The demodulator 410 performs a sync detection by demodulating the received RF signal according to an OFDM parameter, and when a sync is detected, determines whether a mobile frame is received or a fixed frame is received based on information stored in the sync region.

When the OFDM parameter for the signaling region and the OFDM parameter for the data region are not preset, the demodulator 410 may perform a demodulation operation by acquiring the OFDM parameter for the signaling region and the OFDM parameter for the data region stored in the sync region.

The frame de-builder 420 inputs modulated data for signaling region to the BICM decoder 430 for the signaling region.

The BICM decoder 430 decodes the input data to generate BBFRAMEs. In this case, the BICM decoder 430 may perform a decoding operation by acquiring parameters about a FEC coding method, a modulation method, and the like regarding data stored in each data region by using signaling information in the signaling region.

The input de-processor 440 may generate data to be serviced by processing the BBFRAMEs received from the BICM decoder 430.

The data acquisition operation illustrated in FIG. 3B is an example of a case where service data is transmitted through a single PLP. When service data is transmitted through a plurality of PLPs, the plurality of PLPs may be time-divided and decoded by the BICM decoder 430 and a separate controller, according to an exemplary embodiment. In another exemplary embodiment, a plurality of PLPs may be decoded simultaneously by a plurality of BICM decoders.

Figure 4:
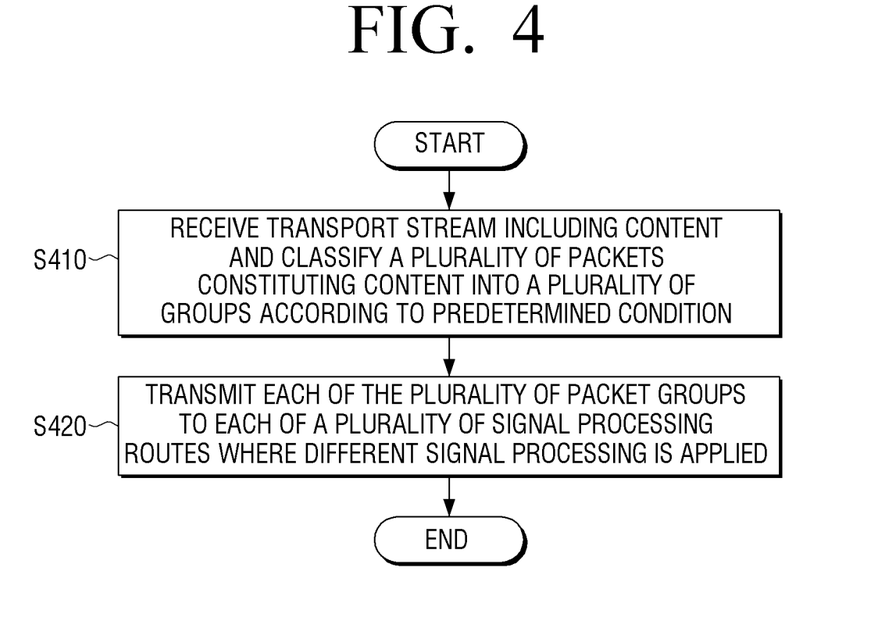
FIG. 4 is a flow chart for explaining a signal processing method according to an exemplary embodiment.

FIG. 4 is a flow chart for explaining a signal processing method according to an exemplary embodiment.

A transport stream including content is received, and a plurality of packets constituting the content is classified into a plurality of packet groups according to a predetermined condition (S410).

For example, a plurality of packets may be classified into a plurality of packet groups according to a type of data constituting the packets. In this case, the type of data constituting the packets may be determined by using a PID included in each of the plurality of packets.

Subsequently, the plurality of packet groups are transmitted through a plurality of signal processing routes where different signal processing operations are applied (S420). In this case, at least one packet which belongs to at least one packet group may be multiplexed with a null packet and transmitted.

The plurality of signal processing routes may encode the plurality of packet groups by using different coding rates, respectively. For example, each of the plurality of signal processing routes may be a PLP defined by the DVB-T2 standard.

According to an exemplary embodiment, a non-transitory computer readable medium including a program which sequentially executes the signal processing methods of the present disclosure may be provided.

The non-transitory computer readable medium is not a medium that stores data for a short period, such as a register, a cache, or a memory, but means a medium which semi-permanently stores data and is readable by a device. To be specific, various applications and programs as described above may be stored and provided in the non-transitory computer readable medium, such as a compact disc (CD), a digital versatile disk (DVD), a hard disk, a Blu-ray disk, a universal serial bus (USB), a memory card, and ac read-only memory (ROM), and the like.

Components, elements or units represented by a block to constitute the apparatuses shown in FIGS. 1, 2A, 3A and 3B in the above exemplary embodiments may be embodied as a various number of hardware, software and/or firmware structures that execute respective operations or functions described above, according to exemplary embodiments. For example, these components, elements or units may use a direct circuit structure, such as a memory, processing, logic, a look-up table, etc. that may execute the respective functions or operations through controls of one or more microprocessors or other control apparatuses. These components, elements or units may be specifically embodied by a module, a program, or a part of code, which contains one or more executable instructions for performing specified logic functions. In addition, although a bus is not depicted in the block diagrams illustrating the apparatuses, communication between the components, elements or units may be performed through the bus.

As given above, although a few desirable exemplary embodiments have been shown and described, the inventive concept is not limited to the these exemplary embodiments, and could be variously modified and achieved by those skilled in the art to which the inventive concept pertains without deviating from the inventive concept.

What is claimed is:

1. A signal processing apparatus comprising:
a packet classifier configured to receive a transport stream comprising a plurality of packets which comprises a content, and divide the plurality of packets into a plurality of packet groups, comprising a first packet group and a second packet group, according to a predetermined condition; and
a transport unit configured to transport the plurality of packet groups through a plurality of signal processing routes, respectively, to each of which a different signal processing method is applied,
wherein the first packet group comprise first data which belong to a base layer, and the second packet group comprises second data which belong to an enhanced layer, and
wherein a signal processing route through which the first packet group is transported provides a more robust encoding operation than a signal processing route through which the second packet group is transported in terms of at least one of a coding type and a coding rate.

2. The apparatus of claim 1, wherein the different signal processing method comprises at least one of a different coding rate, a different coding type, and a different interleaving length or unit.

3. The apparatus of claim 1, wherein the predetermined condition is a type of data constituting the packets.

4. The apparatus of claim 3, wherein the packet classifier determines the type of data constituting the packets from a Packet Identifier (PID) included in each of the plurality of packets.

5. The apparatus of claim 1, wherein the transport unit multiplexes at least one packet included in at least one of the packet groups with at least one null packet and transmits the multiplexed packet.

6. The apparatus of claim 1, wherein each of the plurality of signal processing routes is a Physical Layer Pipe (PLP) defined in the Digital Video Broadcasting-Second Generation Terrestrial (DVB-T2).

7. The apparatus of claim 1, wherein a number of packets included in each packet group is the same as a number of the plurality of packets.

8. The apparatus of claim 7, wherein the plurality of packet groups include the same number of packets.

9. The apparatus of claim 7, wherein at least one packet group includes a null packet so that a number of packets included in the at least one packet group is the same as the number of the plurality of packets.

10. The apparatus of claim 1, wherein the transport stream has the same bit rate as each packet group.

11. The apparatus of claim 1, wherein data included in the first packet group does not refer to another data included in another packet group to provide a service to a user.

12. The apparatus of claim 1, wherein a first packet group comprise left eye image data of a three-dimensional (3D) image and the second packet group comprise right eye image data of the 3D image.

13. The apparatus of claim 1, wherein one packet group or one signal processing route includes information common to all remaining packet groups or all remaining signal processing routes.

14. The apparatus of claim 13, wherein the common information comprises at least one of a Program Association Table, a Program Map Table, a Network Information Table, a Service Description Table and an Event Information Table.

15. A signal processing method comprising:
receiving a transport stream comprising a plurality of packets which comprises a content, and dividing the plurality of packets into a plurality of packet groups, comprising a first and a second packet group, according to a predetermined condition; and transporting the plurality of packet groups through a plurality of signal processing routes, respectively, to each of which a different signal processing method is applied, wherein the first packet group comprise first data which belong to a base layer, and the second packet group comprises second data which belong to an enhanced layer, and wherein a signal processing route through which the first packet group is transported provides a more robust encoding operation than a signal processing route through which the second packet group is transported in terms of at least one of a coding type and a coding rate.

16. The method of claim 15, wherein the different signal processing method comprises at least one of a different coding rate, a different coding type, and a different interleaving length or unit.

17. The method of claim 15, wherein the predetermined condition is a type of data constituting the packets.

18. The method of claim 17, wherein the dividing comprises determining the type of data constituting the packets from a Packet Identifier (PID) included in each of the plurality of packets.

* * * * *